United States Patent
Nishi

(10) Patent No.: US 8,230,315 B2
(45) Date of Patent: Jul. 24, 2012

(54) ENCODER, DECODER, AND ENCODING SYSTEM

(75) Inventor: Takashi Nishi, Osaka (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 763 days.

(21) Appl. No.: 12/379,851

(22) Filed: Mar. 3, 2009

(65) Prior Publication Data
US 2009/0228757 A1 Sep. 10, 2009

(30) Foreign Application Priority Data
Mar. 7, 2008 (JP) ................................. 2008-058382

(51) Int. Cl.
*H03M 13/00* (2006.01)
(52) U.S. Cl. ..................................................... 714/800
(58) Field of Classification Search .......... 714/748–751, 714/774, 779–786, 788, 790, 799–805, 821
See application file for complete search history.

(56) References Cited

U.S. PATENT DOCUMENTS

| | | | |
|---|---|---|---|
| 6,189,125 B1* | 2/2001 | Classon | 714/783 |
| 6,675,348 B1* | 1/2004 | Hammons et al. | 714/790 |
| 7,000,174 B2* | 2/2006 | Mantha et al. | 714/790 |
| 2003/0126550 A1* | 7/2003 | Stralen et al. | 714/786 |
| 2006/0107192 A1* | 5/2006 | Mantha et al. | 714/800 |
| 2008/0098276 A1* | 4/2008 | Naoi | 714/751 |
| 2008/0141103 A1* | 6/2008 | Miyazaki et al. | 714/801 |
| 2008/0141104 A1* | 6/2008 | Miyazaki et al. | 714/801 |

OTHER PUBLICATIONS

Aaron et al., 'Transform-Domain Wyner-Ziv Codec for Video', Proc. SPIE Visual Comunications and Image Processing, San Jose, California, 2004.
Japanese Translation of "Sklar, Digital Communication: Fundamentals and Applications, Prentice-Hall, 2001", translated by Morinaga, et al., and published on May 22, 2006, by Pearson Education, Japan, 2006, pp. 457-467.

* cited by examiner

*Primary Examiner* — Nadeem Iqbal
(74) *Attorney, Agent, or Firm* — Rabin & Berdo, P.C.

(57) ABSTRACT

A coding system in which the coding apparatus generates information bits and parity bits and transmits the parity bits and information bits selectively to the decoding apparatus. The decoding apparatus predicts the information bits, stores the predicted information bits, also stores the parity and information bits received from the encoding apparatus, combines the received information bits with the predicted information bits, and uses an error correcting decoder to decode the combined information bits and the stored parity bits. Combining the predicted information bits with received information bits improves decoding accuracy and enables the decoding apparatus to conserve computational resources.

13 Claims, 14 Drawing Sheets

FIG.3A
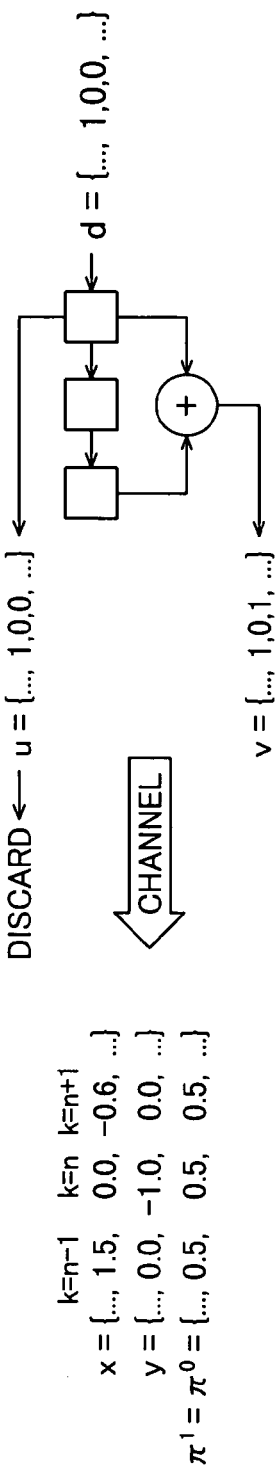
FIG.3B
$x = [..., 1.5, 0.0, -0.6, ...]$ at $k=n-1, k=n, k=n+1$
$y = [..., 0.0, -1.0, 0.0, ...]$
$\pi^1 = \pi^0 = [..., 0.5, 0.5, 0.5, ...]$
FIG.3C
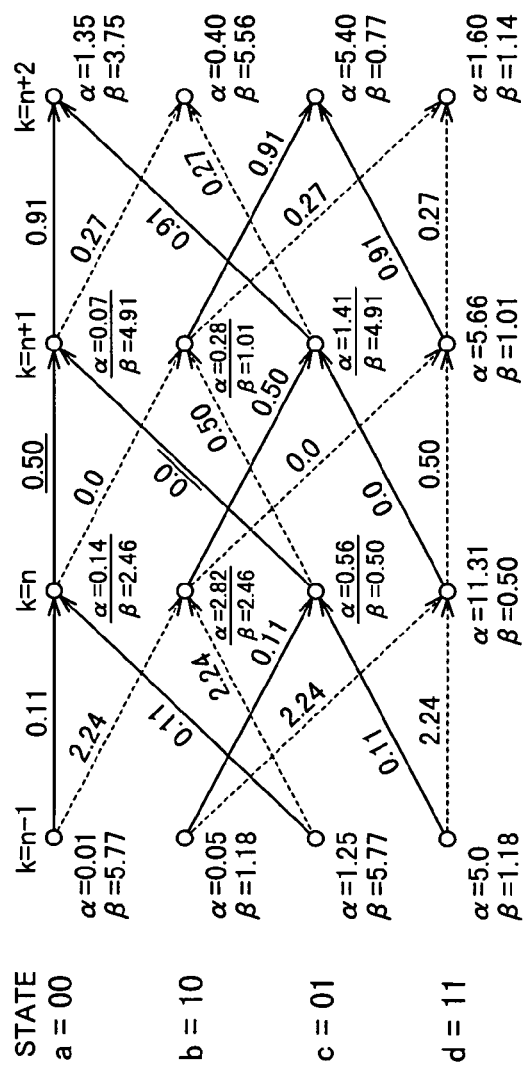

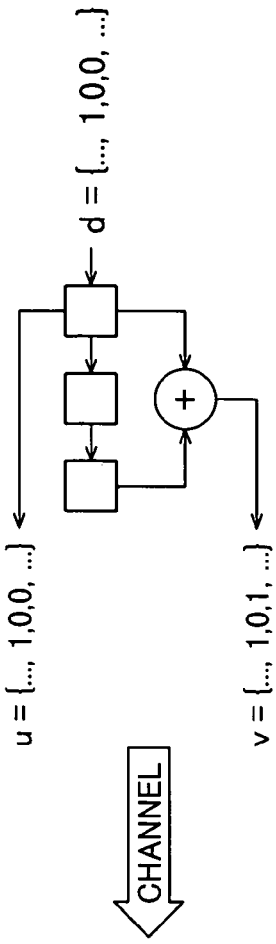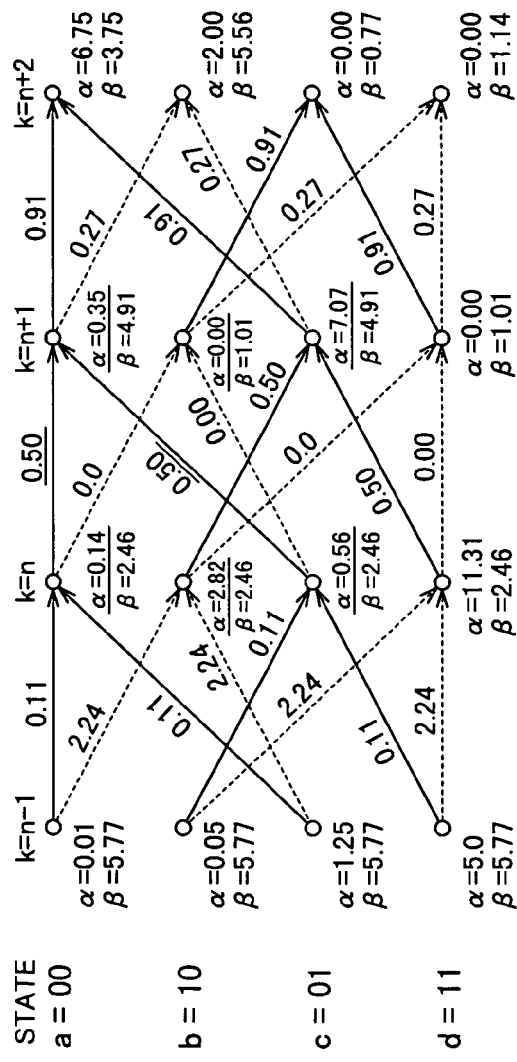

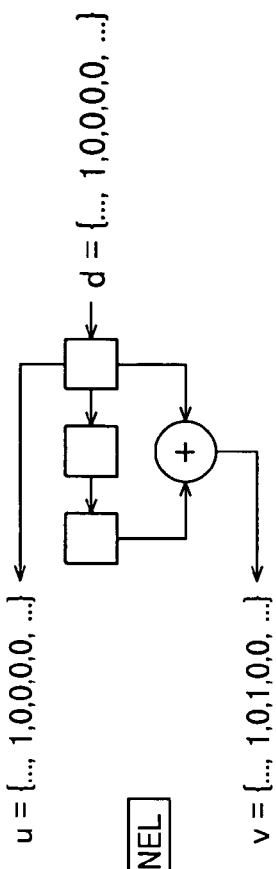
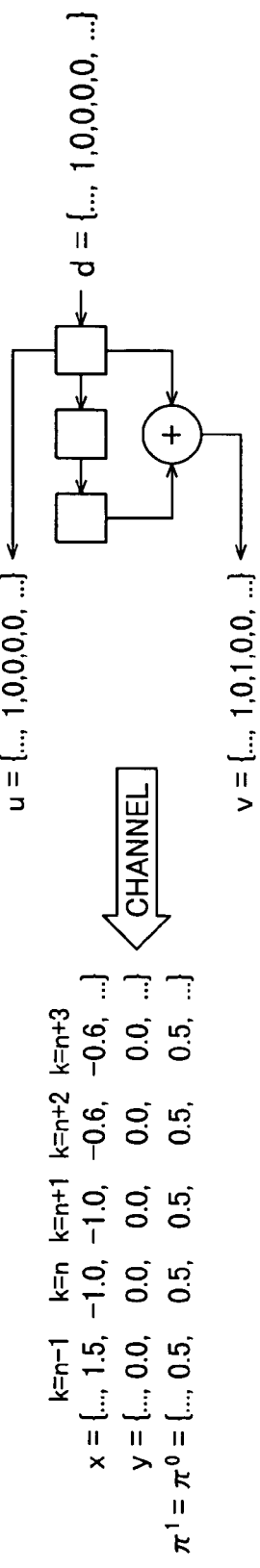
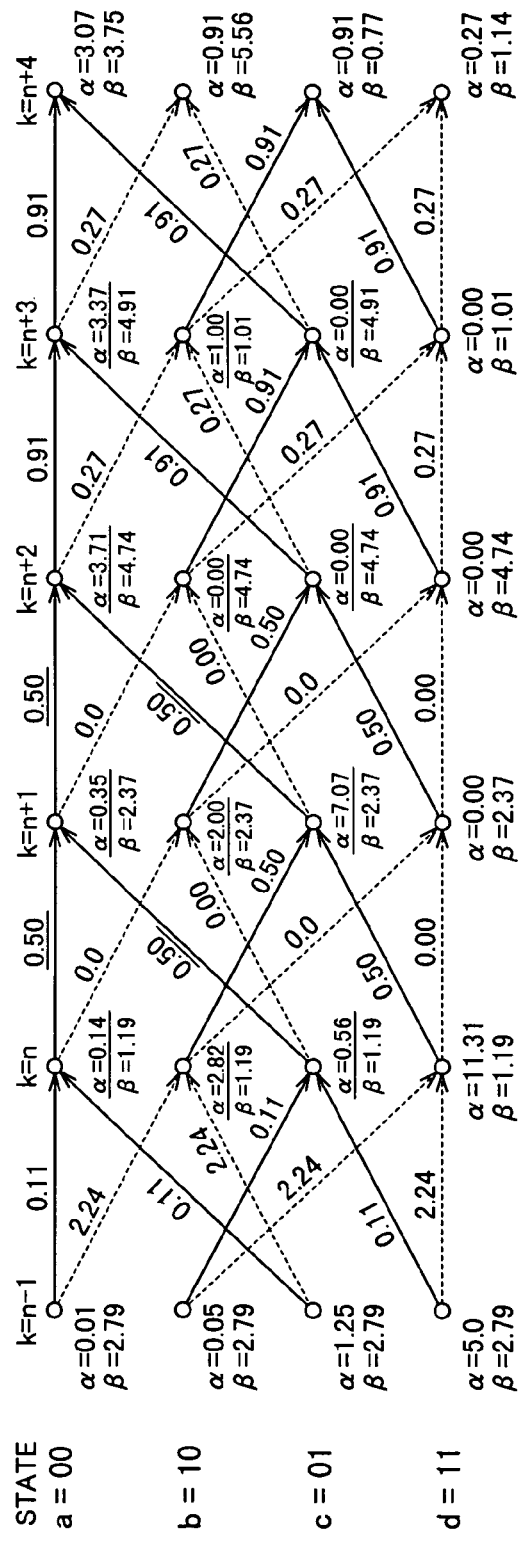

ENCODER, DECODER, AND ENCODING SYSTEM

BACKGROUND OF THE INVENTION

1. Field of the Invention

The present invention relates to an encoder, a decoder, and a coding system, and is particularly applicable to the Slepian-Wolf coding system used in, for example, distributed video coding.

2. Description of the Related Art

Distributed video coding (DVC) is a new coding method that has grown out of coding theoretical research by Slepian and Wolf and further work by Wyner, Ziv, and others. In one DVC method, the encoder carries out only intraframe coding, while the decoder carries out both intraframe and interframe decoding. Distributed video coding has been attracting considerable attention because it can greatly reduce the computational load on the encoder.

An example of distributed coding is outlined in FIG. 1, which is taken from Aaron et al., 'Transform-Domain Wyner-Ziv Codec for Video', *Proc. SPIE Visual Communications and Image Processing*, San Jose, Calif., 2004. In the encoder, a video image sequence is divided into key frames, to which conventional intraframe coding and decoding are applied, and so-called Wyner-Ziv frames, to which Slepian-Wolf coding and decoding processes are applied. In the encoding process, a discrete cosine transform (DCT) is used to transform each Wyner-Ziv frame to the coefficient domain, the coefficients are grouped into bands, the coefficients in the k-th band are quantized by a $2^{M_k}$-level quantizer, the quantized coefficients ($q_k$) are expressed in fixed numbers of bits, and the bit planes are extracted and supplied to a Slepian-Wolf encoder that that produces information bits and error-correcting bits, called parity bits. The parity bits are stored in a buffer for transmission to the decoder. The information bits are discarded (as implied but not explicitly shown by Aaron et al.).

To decode a Wyner-Ziv frame, the decoder generates a predicted image by interpolation or extrapolation from one or more key frames, applies a DCT to convert the predicted image to the coefficient domain, groups the coefficients into bands, and inputs the coefficients in each band as side information to a Slepian-Wolf decoder (a type of turbo decoder) The Slepian-Wolf decoder requests the parity bits it needs to detect and correct errors in the side information. If necessary, further parity bits can be requested and the turbo decoding process can be repeated until a satisfactorily consistent result is obtained.

Finally, the decoded values and the side information are both used to reconstruct the coefficients of the Wyner-Ziv frame, and an inverse discrete cosine transform (IDCT) is carried out to recover the image.

FIG. 2 further illustrates the processes from Slepian-Wolf coding to Slepian-Wolf decoding. The systematic encoder 101 in the encoding apparatus 100A is a type of Slepian-Wolf turbo encoder that generates information bits and parity bits separately. The information bits are discarded; the parity bits are stored in a parity bit buffer 102. Some of the parity bits are sent immediately to a parity bit transmitter 203 and transmitted to the decoding apparatus 100B; the other parity bits are held until requested by the decoding apparatus 100B.

In the decoding apparatus 100B, the transmitted parity bits are received by a parity bit receiver 209 and placed in a parity bit buffer 108, from which they are supplied to an error correcting decoder 107. An information bit predictor 112 supplies predicted information bits to the error correcting decoder 107. The error correcting decoder 107 uses the parity bits to carry out an error-correcting decoding process. If this does not produce a satisfactory decoded result, a transmission request signal controller 213 generates a transmission request signal, which is transmitted by a transmission request signal transmitter 214 to the encoding apparatus 100A as a request for more parity bits. The request is received by a transmission request signal receiver 206 in the encoding apparatus 100A and passed to a parity bit transmission controller 205. Operating according to a predetermined table, the parity bit transmission controller 205 controls the parity bit buffer 102 and parity bit transmitter 203 so as to transfer additional parity bits from the parity bit buffer 102 to the parity bit transmitter 203 and transmit them to the decoding apparatus 100B. This process is iterated until a satisfactory decoded result is obtained.

The error correcting decoder 107 may use the maximum a-posteriori probability (MAP) decoding algorithm described by Sklar in *Digital Communication: Fundamentals and Applications*, Prentice-Hall, 2001. This algorithm, which is used in turbo coding and other coding methods, is a high-performance error-correcting decoding method in which the coder uses the parity bits and predicted information bits, which are predicted at the decoder, to calculate the probability that each information bit is 0 or 1.

The conventional coding and decoding operations are illustrated in FIGS. 3A, 3B, and 3C. The systematic encoder 101, represented schematically in FIG. 3A, is a convolutional encoder with a constraint length of three and a coding rate of one-half. At times n−1, n, and n+1, the encoder receives data bits d {1, 0, 0}, outputs them as information bits u {1, 0, 0}, and generates parity bits v {1, 0, 1}. The parity bit v (0) for time n, for example, is transmitted to the decoding apparatus 100B. The parity bits v (1) for times n−1 and n+1 are not transmitted (unless requested later), and the information bits u are never transmitted.

In the decoder, bit values are represented algebraically: a 0 parity bit is represented as −1, for example, and a 1 parity bit as +1. Predicted values x of information bits are represented by positive and negative values indicating likelihoods that the true value of the bit is 1 or 0. In FIG. 3B, the predicted values at time n are {1.5, 0.0, −0.6} and the received parity bit values y are {0.0, −1.0, 0.0}, where 0.0 represents a non-transmitted parity bit. The a-priori probabilities $\pi^{i=0}k$ are 0.5; a bit is equally likely to be 1 or 0 ($\pi^1 = \pi^0$).

At an arbitrary time k, the encoder may be in one of four states (a, b, c, d) representing the two most recent input data bits. Branch metrics can be calculated for all possible state transitions from time k to time k+1. For example, a branch metric $\delta^{i=0,m=1}_k$ for the transition from state a (m=a) caused by input of a data bit with value 0 (i=0) at time k at which the predicted value of the information bit $x_k$, if consistent with the parity bit output at time k, is $A_k \pi^{i=0}_k \exp(-x_k/\sigma^2)$, where $A_k$ and $\sigma^2$ are parameters. For the transition from state a at time n (k=n), when $x_k$=0.0, to state a at time n+1, which is consistent with the output of the known parity bit value of 0 at time n, if the parameters $A_k$ and $\sigma^2$ are both equal to unity, the branch metric is calculated as follows.

$$\begin{aligned}\delta^{i=0,m=a}_k &= A_k \pi^{i=0}_k \exp(-x_k/\sigma^2) \quad (1)\\ &= 0.5 \exp(-x_k) \\ &= 0.5 \exp(-(0.0)) \\ &= 0.5\end{aligned}$$

Branch metrics for the transitions from the other states b (10), c (01), and d (11) that produce 0 parity bits at time n are calculated similarly as shown by equations (2) to (4).

$$\delta_k^{i=0,m=b} = A_k \pi_k^{j=0} \exp(-x_k/\sigma^2) \qquad (2)$$
$$= 0.5\exp(-x_k)$$
$$= 0.5\exp(-(0.0))$$
$$= 0.5$$

$$\delta_k^{i=1,m=c} = A_k \pi_k^{j=0} \exp(-x_k/\sigma^2) \qquad (3)$$
$$= 0.5\exp(-x_k)$$
$$= 0.5\exp(-(0.0))$$
$$= 0.5$$

$$\delta_k^{i=1,m=d} = A_k \pi_k^{j=0} \exp(-x_k/\sigma^2) \qquad (4)$$
$$= 0.5\exp(-x_k)$$
$$= 0.5\exp(-(0.0))$$
$$= 0.5$$

If the parity bits are assumed to be received without corruption, there is zero likelihood that the parity bit value is 1, so the remaining branch metrics are zero as indicated in equations (5) to (8).

$$\delta^{i=1,m=a}_k = 0 \qquad (5)$$
$$\delta^{i=1,m=b}_k = 0 \qquad (6)$$
$$\delta^{i=0,m=c}_k = 0 \qquad (7)$$
$$\delta^{i=0,m=d}_k = 0 \qquad (8)$$

Given a guaranteed value of 0 for the parity bit input at the transition from time n to time n+1, in state a an information bit value of 1 cannot be output, as can be seen from the trellis diagram in FIG. 3C.

For the transition from time n−1 to time n, branch metrics are calculated as follows. If the state at time n−1 is a and if the encoding apparatus does not transmit a parity bit, the calculation can be divided into two cases, depending on whether the parity bit value is 0 or 1, and can be expressed by equations (9) and (10), in which $$u^{i=0}_{k=n-1} = 1$$

and $$u^{i=1}_{k=n-1} = -1.$$

Equation (9) gives the branch metric expressed by equation (11), and equation (10) gives the branch metric expressed by equation (12).

$$\delta_{k=n-1}^{i=0,m} = A_{k=n-1} \pi_{k=n-1}^{j=0} \exp(x_{k=n-1} u_{k=n-1}^{j=0}/\sigma^2) \qquad (9)$$
$$= A_{k=n-1} \pi_{k=n-1}^{j=0} \exp(-x_{k=n-1}/\sigma^2)$$

$$\delta_{k=n-1}^{i=1,m} = A_{k=n-1} \pi_{k=n-1}^{j=1} \exp(x_{k=n-1} u_{k=n-1}^{j=1}/\sigma^2) \qquad (10)$$
$$= A_{k=n-1} \pi_{k=n-1}^{j=1} \exp(x_{k=n-1}/\sigma^2)$$

$$\delta_{k=n-1}^{i=1,m} = A_{k=n-1} \pi_{k=n-1}^{j=0} \exp(-x_{k=n-1}/\sigma^2) \qquad (11)$$
$$= 0.5\exp(-x_{k=n-1})$$
$$= 0.5\exp(-(1.5))$$
$$= 0.11$$

$$\delta_{k=n-1}^{i=1,m} = A_{k=n-1} \pi_{k=n-1}^{j=1} \exp(x_{k=n-1}/\sigma^2) \qquad (12)$$
$$= 0.5\exp(x_{k=n-1})$$
$$= 0.5\exp(1.5)$$
$$= 2.24$$

Branch metric calculations for the transition from time n+1 to time n+2 are the same as for the transition from time n to time n+1. The results are shown in FIG. 3C.

The method of calculating decoded bit values will be described with further reference to FIG. 3C.

A forward state metric α and backward state metric β for each state at each time can be calculated by multiplying the branch metrics of the paths converging on the state by the state metrics of the states from which those paths originate and adding the results. Given the state metrics at time n shown in FIG. 3C, for example, the forward state metric α for state a at time n+1 is calculated as in equation (13). The forward state metrics α for the other states are calculated similarly.

$$\alpha = 0.14 \times 0.50 + 0.56 \times 0.0 = 0.07 \qquad (13)$$

The backward state metrics β are calculated in the same way as the forward state metrics α, except for the direction of calculation (right to left in FIG. 3C, instead of left to right).

The process for calculating decoded values will now be described. Specifically, the process of decoding the information bit for the transition from time n−1 to time n will be described. If an information bit value of 0 is assumed to have been input for the transition from time n−1 to time n, a value is calculated as expressed by equation (14). If an information bit value of 1 is assumed to have been input for the transition from time n−1 to time n, a value is calculated as expressed by equation (15). Based on these calculated values, the log likelihood of the bit value obtained by equation (16) is 1.31. As this value is positive, a decoded information bit value of 1 is obtained; the bit is correctly decoded.

$$\alpha_{k=n-1}^{m=a} \times \delta_{k=n-1}^{i=0,m=a} \times \beta_{k=n}^{m=a} + \alpha_{k=n-1}^{m=b} \times \delta_{k=n-1}^{i=0,m=b} \times \beta_{k=n}^{m=c} + \qquad (14)$$
$$\alpha_{k=n-1}^{m=c} \times \delta_{k=n-1}^{i=0,m=c} \times \beta_{k=n}^{m=a} + \alpha_{k=n-1}^{m=d} \times \delta_{k=n-1}^{i=0,m=d} \times \beta_{k=n}^{m=c} =$$
$$0.01 \times 0.11 \times 2.46 + 0.05 \times 0.11 \times 0.56 +$$
$$1.25 \times 0.11 \times 2.46 + 5.0 \times 0.11 \times 0.50 = 0.620630285$$

$$\alpha_{k=n-1}^{m=a} \times \delta_{k=n-1}^{i=1,m=a} \times \beta_{k=n}^{m=b} + \alpha_{k=n-1}^{m=b} \times \delta_{k=n-1}^{i=1,m=b} \times \beta_{k=n}^{m=d} + \qquad (15)$$
$$\alpha_{k=n-1}^{m=c} \times \delta_{k=n-1}^{i=1,m=c} \times \beta_{k=n}^{m=b} + \alpha_{k=n-1}^{m=d} \times \delta_{k=n-1}^{i=1,m=d} \times \beta_{k=n}^{m=d} =$$
$$5.77 \times 2.24 \times 2.46 + 0.05 \times 2.24 \times 0.50 +$$
$$1.25 \times 2.24 \times 2.46 + 5.0 \times 2.24 \times 0.50 = 12.63828944$$

$$\log(12.63829/0.620630285) = 1.31 \qquad (16)$$

The method of decoding an information bit for the transition from time n to time n+1 will now be described. If an information bit value of 0 is assumed to have been input for the transition from time n to time n+1, a value is calculated as expressed by equation (17). If an information bit value of 1 is assumed to have been input for the transition from time n to time n+1, a value is calculated as expressed by equation (18). Based on these calculated values, the log likelihood of the bit value obtained by equation (19) is −0.08. As this value is negative, a decoded information bit value of 0 is obtained; this bit is also decoded correctly.

$$\alpha_{k=n}^{m=a} \times \delta_{k=n}^{i=0,m=a} \times \beta_{k=n+1}^{m=a} + \alpha_{k=n}^{m=b} \times \delta_{k=n}^{i=0,m=b} \times \beta_{k=n+1}^{m=c} + \quad (17)$$
$$\alpha_{k=n}^{m=c} \times \delta_{k=n}^{i=0,m=c} \times \beta_{k=n+1}^{m=a} + \alpha_{k=n}^{m=d} \times \delta_{k=n}^{i=0,m=d} \times \beta_{k=n+1}^{m=c} =$$
$$0.14 \times 0.50 \times 4.91 + 2.82 \times 0.50 \times 4.91 +$$
$$0.56 \times 0.0 \times 4.91 + 11.31 \times 0.0 \times 4.91 = 7.27473285$$

$$\alpha_{k=n}^{m=a} \times \delta_{k=n}^{i=1,m=a} \times \beta_{k=n+1}^{m=b} + \alpha_{k=n}^{m=b} \times \delta_{k=n}^{i=1,m=b} \times \beta_{k=n+1}^{m=d} + \quad (18)$$
$$\alpha_{k=n}^{m=c} \times \delta_{k=n}^{i=1,m=c} \times \beta_{k=n+1}^{m=b} + \alpha_{k=n}^{m=d} \times \delta_{k=n}^{i=1,m=d} \times \beta_{k=n+1}^{m=d} =$$
$$0.14 \times 0.0 \times 1.01 + 2.82 \times 0.0 \times 1.01 + 0.56 \times 0.50 \times 1.01 +$$
$$11.31 \times 0.50 \times 1.01 = 5.984186875$$

$$\log(5.984187 / 7.27473285) = -0.08 \quad (19)$$

The method of decoding an information bit for the transition from time n+1 to time n+2 will also be described. If an information bit value of 0 is assumed to have been input for the transition from time n+1 to time n+2, a value is calculated as expressed by equation (20). If an information bit value of 1 is assumed to have been input for the transition from time n+1 to time n+2, a value is calculated as expressed by equation (21). Based on these calculated values, the log likelihood of the bit value obtained by equation (22) is −0.36. As this value is negative, a decoded information bit value of 0 is obtained, which is again the correctly decoded value of the bit.

$$\alpha_{k=n+1}^{m=a} \times \delta_{k=n+1}^{i=0,m=a} \times \beta_{k=n+2}^{m=a} + \alpha_{k=n+1}^{m=b} \times \delta_{k=n+1}^{i=0,m=b} \times \beta_{k=n+2}^{m=c} + \quad (20)$$
$$\alpha_{k=n+1}^{m=c} \times \delta_{k=n+1}^{i=0,m=c} \times \beta_{k=n+2}^{m=a} + \alpha_{k=n+1}^{m=d} \times \delta_{k=n+1}^{i=0,m=d} \times \beta_{k=n+2}^{m=c} =$$
$$0.07 \times 0.91 \times 3.75 + 0.28 \times 0.91 \times 0.77 +$$
$$1.41 \times 0.91 \times 3.75 + 5.66 \times 0.91 \times 0.77 = 9.209984875$$

$$\alpha_{k=n+1}^{m=a} \times \delta_{k=n+1}^{i=1,m=a} \times \beta_{k=n+2}^{m=b} + \alpha_{k=n+1}^{m=b} \times \delta_{k=n+1}^{i=1,m=b} \times \beta_{k=n+2}^{m=d} + \quad (21)$$
$$\alpha_{k=n+1}^{m=c} \times \delta_{k=n+1}^{i=1,m=c} \times \beta_{k=n+2}^{m=b} + \alpha_{k=n+1}^{m=d} \times \delta_{k=n+1}^{i=1,m=d} \times \beta_{k=n+2}^{m=d} =$$
$$0.07 \times 0.27 \times 5.56 + 0.28 \times 0.27 \times 1.60 +$$
$$1.41 \times 0.27 \times 1.14 + 5.66 \times 0.27 \times 1.14 = 4.04893485$$

$$\log(4.048935 / 9.209984875) = -0.36 \quad (22)$$

FIG. 4 illustrates the result of removing paths with branch metric values of zero from the trellis diagram in FIG. 3C. If a single parity bit can be received correctly, the computations for four paths can be eliminated, as shown in the figure.

The MAP algorithm is known to yield extremely good error-correcting results, but as these examples show, it requires extensive computation.

The algorithm allows high-speed processing of a relatively small amount of information, such as sound information, but high-speed processing of larger amounts of information, such as video image information, is difficult. A high-performance computing device (a high-performance microprocessor or central processing unit, for example) is required and much power is consumed.

The MAP algorithm also requires considerable memory space for storing computation results. This requirement, like the requirement for computing power, increases with the amount of information to be processed, so that more memory space is required for video and other massive types of information than for sound information. This requirement increases the size of the decoding apparatus.

There is a need for an encoder, a decoder, and a coding system that can reduce the necessary amounts of computation and memory in the decoder.

SUMMARY OF THE INVENTION

The invention provides an encoding apparatus having a systematic encoder that generates information bits representing data input to the encoder, and parity bits providing redundancy for error correction. The encoding apparatus also has an information bit storage unit for storing the generated information bits, a parity bit storage unit for storing the generated parity bits, a bit transmission controller for controlling the output of the bits stored in the information bit storage unit and the parity bit storage unit, and a bit transmitter for selectively transmitting both information bits and parity bits output from the storage units under control of the bit transmission controller.

The invention also provides a decoding apparatus having a bit receiver for receiving the parity bits and information bits transmitted from the encoding apparatus, an information bit storage unit for storing the received information bits, a parity bit storage unit for storing the received parity bits, an information bit predictor for predicting the information bits, an input information generator for generating input information bits by combining the predicted information bits and the received information bits, and an error correcting decoder for decoding the input information bits and the stored parity bits.

The invention further provides a coding system including the above encoding apparatus and the above decoding apparatus. The coding system may also include an error-free channel on which the information bits and parity bits are transmitted from the encoding apparatus and the decoding apparatus. Alternatively, the bit transmitter may encode the transmitted bits using an error-correcting code that enables transmission errors occurring in the channel to be corrected by the bit receiver.

The decoding apparatus may also have a transmission request signal transmitter for transmitting transmission request signals to the encoding apparatus, and a transmission request control unit for controlling the transmission of request signals according to status information received from the error correcting decoder. The transmission request signals may request further information bits or further parity bits, or both. The transmission request signals may also specify whether consecutive or non-consecutive information bits are to be transmitted.

The encoding apparatus, decoding apparatus, and encoding system provided by the present invention can reduce the computational load and memory usage in the decoding apparatus.

BRIEF DESCRIPTION OF THE DRAWINGS

In the attached drawings:

FIGS. 3A, 3B, and 3C illustrate the operation of the error correcting decoder in FIG. 2;

FIGS. 7A, 7B, and 7C illustrate the operation of the error correcting decoder in the first embodiment;

FIGS. 13A, 13B, and 13C illustrate the operation of the error correcting decoder in the second embodiment when memory usage is reduced.

DETAILED DESCRIPTION OF THE INVENTION

Figure 1:
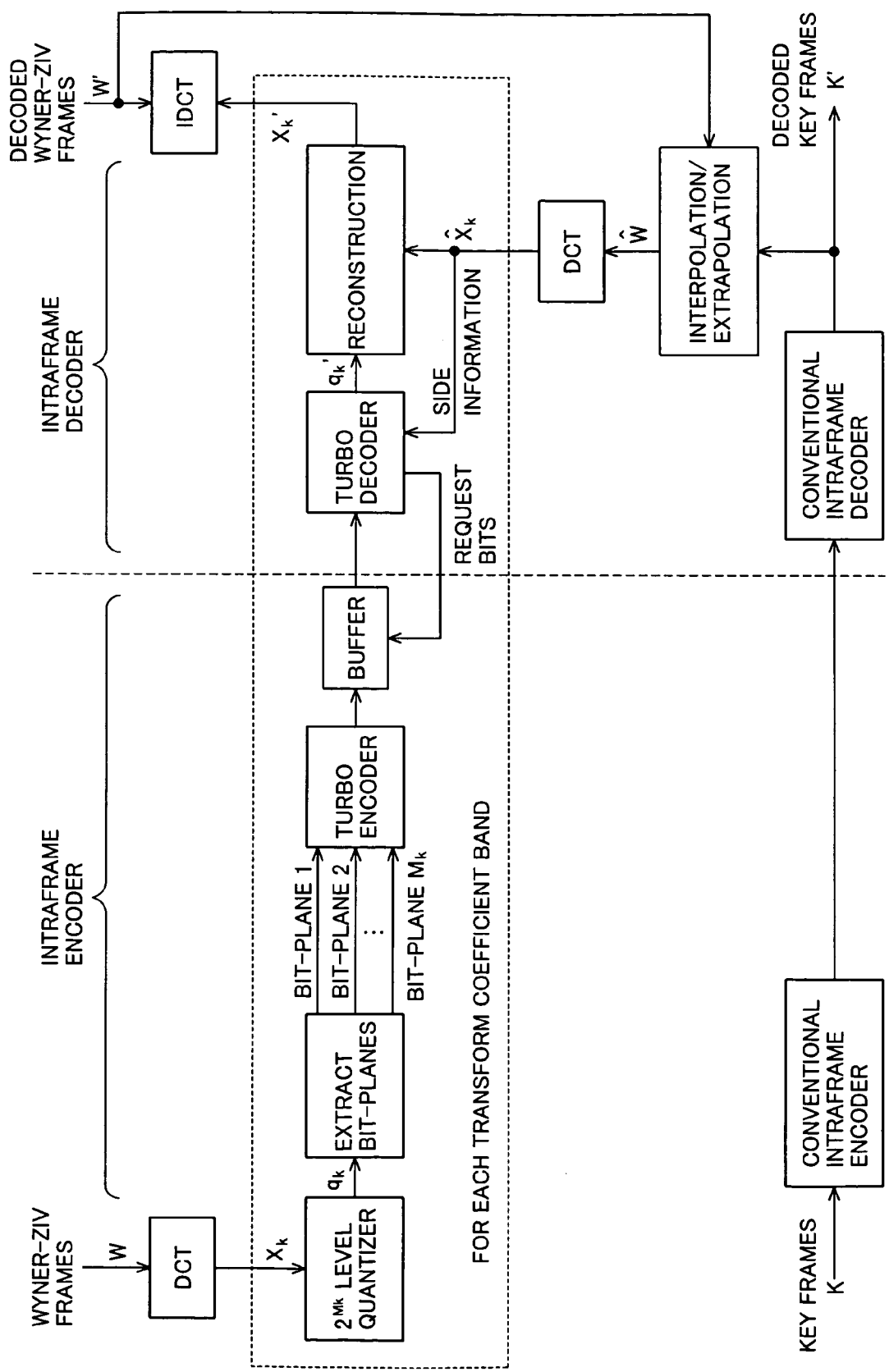
FIG. 1 is an explanatory diagram illustrating conventional distributed video coding.
Figure 2:
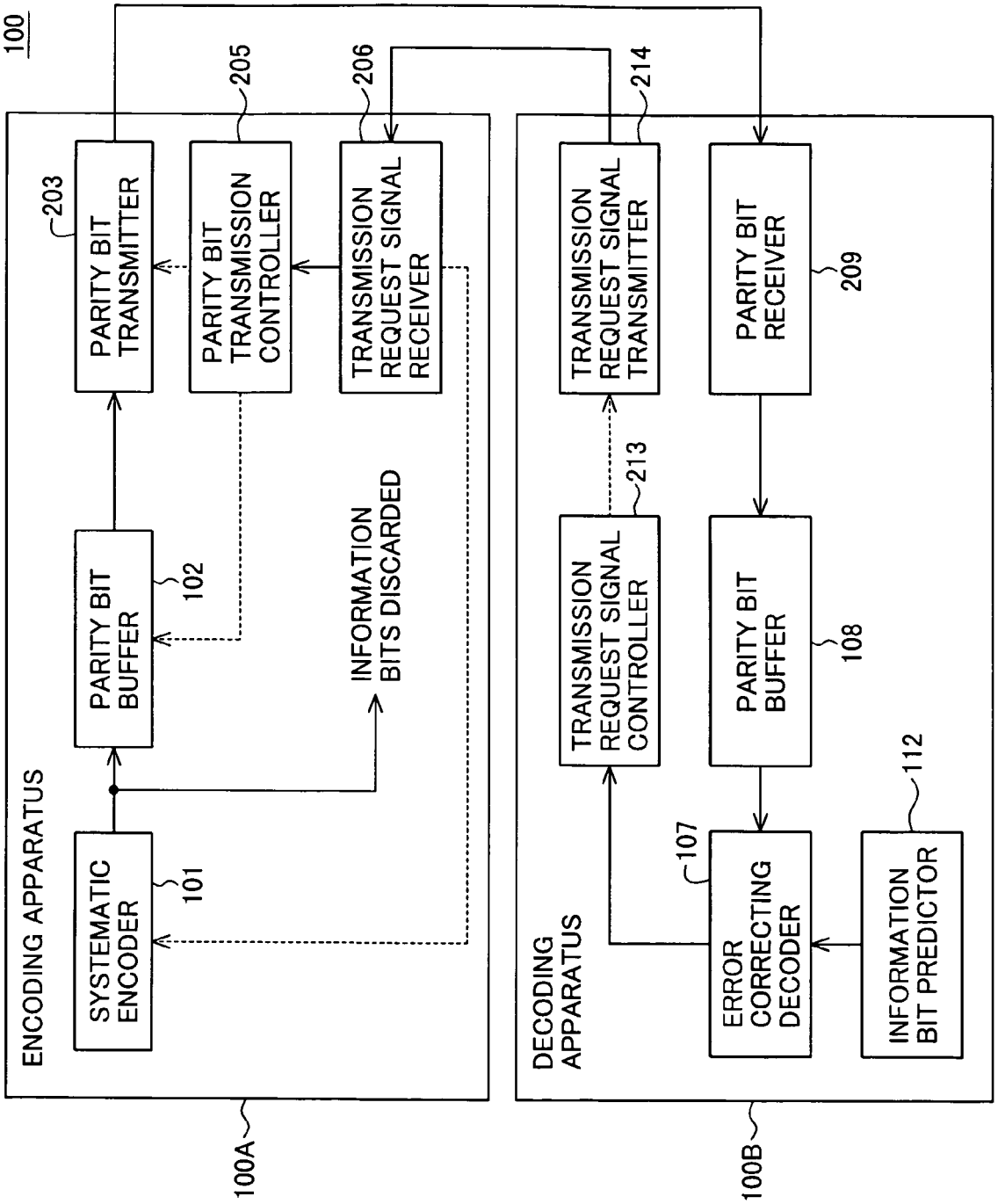
FIG. 2 is a block diagram illustrating apparatus for conventional Slepian-Wolf coding and decoding.

Embodiments of the invention will now be described with reference to the attached drawings, in which like elements are indicated by like reference characters.

First Embodiment

Figure 5:
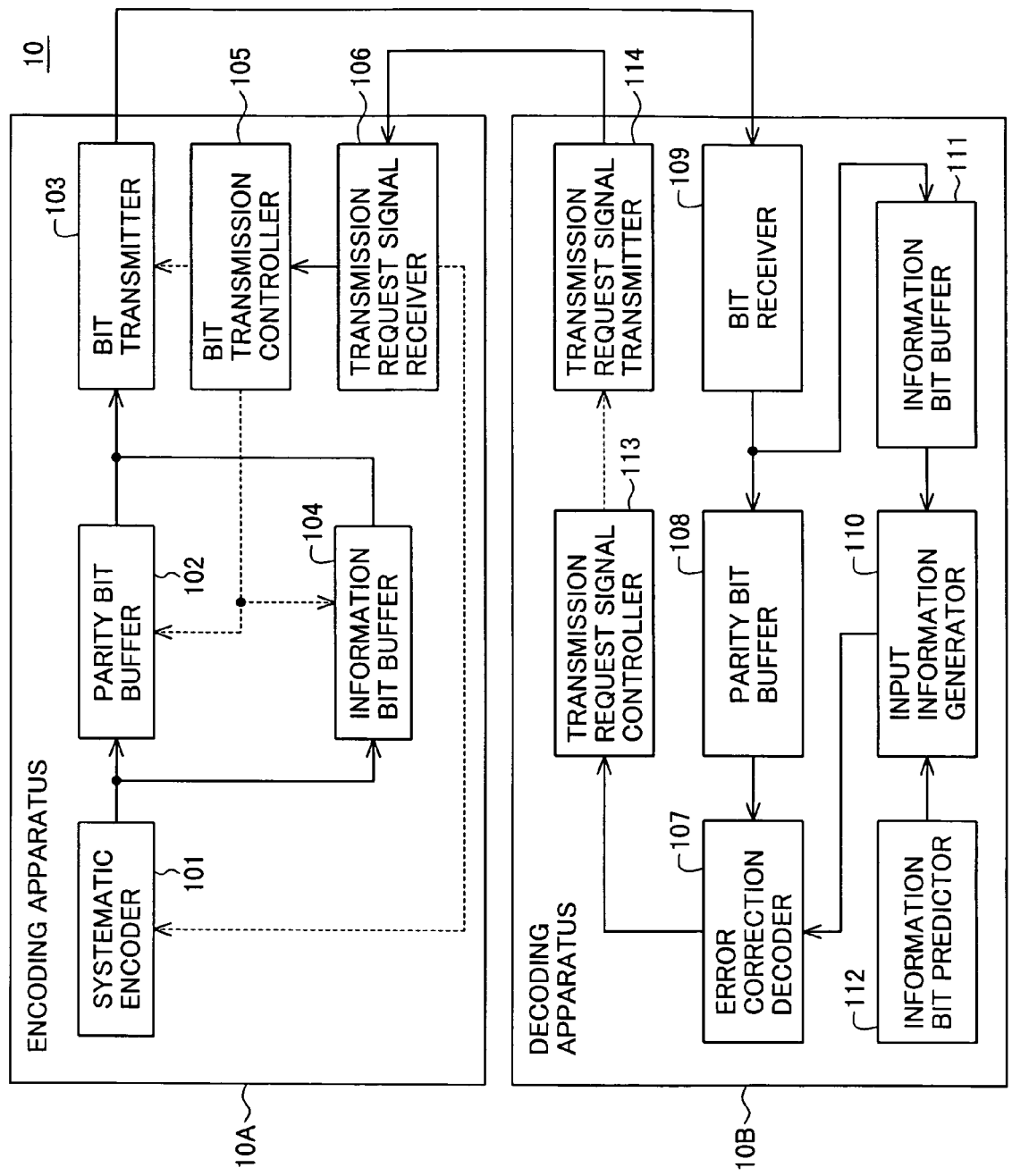
FIG. 5 is a block diagram showing the structure of a coding system according to a first embodiment of the invention.

Referring to FIG. 5, the first embodiment is a coding system 10 comprising an encoding apparatus 10A and a decoding apparatus 10B. The encoding apparatus 10A encodes input information, sends encoded data to the decoding apparatus 10B, and receives requests for additional bits from the decoding apparatus 10B. The decoding apparatus 10B receives and decodes the encoded data and may request additional bits from the encoding apparatus 10A.

The encoding apparatus 10A comprises a systematic encoder 101 for coding input information to generate information bits and parity bits, a parity bit buffer 102 for storing the parity bits generated by the systematic encoder 101, a information bit buffer 104 for storing the information bits generated by the systematic encoder 101, a bit transmitter 103 for transmitting the information bits and parity bits selectively, a bit transmission controller 105 for controlling the transmission of bits by the bit transmitter 103, and a transmission request signal receiver 106 for receiving requests from the decoding apparatus and passing the requests to the bit transmission controller 105.

The decoding apparatus 10B comprises a bit receiver 109 for receiving information bits and parity bits from the encoding apparatus, a parity bit buffer 108 for storing the parity bits received by the bit receiver 109, an information bit buffer 111 for storing the information bits received by the bit receiver 109, an information bit predictor 112 for predicting the information bits, an input information generator 110 for generating information bits for input to an error correcting decoder 107 from the bits predicted by the information bit predictor 112 and the bits output from the information bit buffer 111, an error correcting decoder 107 for carrying out an error-correcting decoding process on the information bits generated by the input information generator 110 and the parity bits stored in the parity bit buffer 108, a transmission request signal controller 113 for controlling the sending of requests for the transmission of additional information bits or parity bits to the encoding apparatus, responsive to status information supplied by the error correcting decoder 107, and a transmission request signal transmitter 114 for sending transmission requests to the encoding apparatus as specified by the transmission request signal controller 113.

The parity bits generated by the systematic encoder 101 function as compressively encoded image information. If the parity bits are corrupted in transmission between the encoding apparatus 10A and 10B, the decoding accuracy suffers significantly. To avoid such corruption, before transmitting the parity bits and information bits, the bit transmitter 103 adds information that enables transmission errors to be detected and corrected by the bit receiver 109. That is, the bit transmitter encodes the transmitted bits by using an error correcting code strong enough to correct all anticipated transmission errors. Alternatively, the bit transmitter 103 may simply add error detection information such as a check code to the transmitted bits, and the bit receiver 109 may request retransmission if an error is detected. As another alternative, the bit transmitter 103 and bit receiver 109 may be interconnected by an error-free transmission channel.

Figure 6:
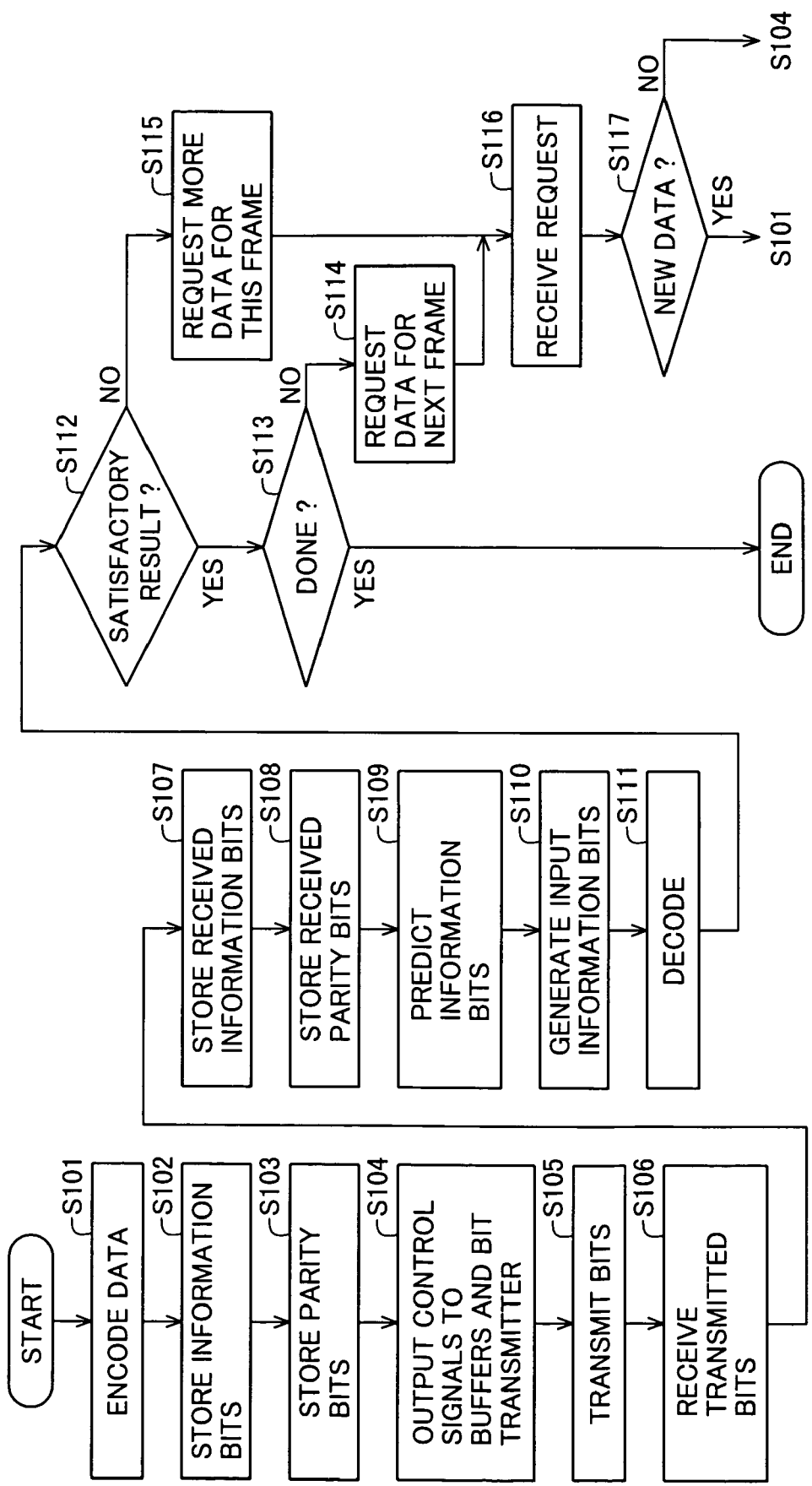
FIG. 6 is a flowchart illustrating the operation of the coding system in the first embodiment.

The operation of the coding system 10 in the first embodiment will be described with reference to the flowchart in FIG. 6.

When the data to be encoded are input, the systematic encoder 101 encodes the data and generates information bits and parity bits (step S101). The systematic code employed by the systematic encoder 101 makes a clear distinction between information bits, which represent the input data, and parity bits, which provide redundant information for detecting and correcting errors in the information bits. A convolutional encoder or a turbo encoder may be used, for example.

The information bits generated by the systematic encoder 101 are stored in the information bit buffer 104 (step S102), and the parity bits generated by the systematic encoder 101 are stored in the parity bit buffer 102 (step S103).

The bit transmission controller 105 gives the parity bit buffer 102, information bit buffer 104, and bit transmitter 103 an instruction to transmit the parity bits or information bits in accordance with a predetermined table or the like (step S104). The bit transmitter 103 transmits the specified bits (step S105). The table may be similar to the puncturing tables generally used for the puncturing of parity bits. The table can control the transmission of parity bits to the decoding apparatus so that, for example, one of every sixteen parity bits is transmitted and control the transmission of the information bits so that one out of every thirty-two information bits is transmitted.

The bits are transmitted from the encoding apparatus through a communication channel and are received by the decoding apparatus 10B, more specifically by the bit receiver 109 (step S106). The information bits received by the bit receiver 109 are stored in the information bit buffer 111 (step S107), and the received parity bits are stored in the parity bit buffer 108 (step S108).

The information bit predictor 112 predicts the information bits generated by the encoding apparatus (step S109) by using data decoded before. The information bits of a video image frame are predicted from a preceding frame or by interpolation between preceding and following frames. The information bits of a sound waveform are predicted from past waveform information by detecting short-term periodicities by autocorrelation processing and by detecting the envelope of the waveform.

The input information generator 110 generates input information bits for input to the error correcting decoder 107 from the information bits predicted by the information bit predictor 112 and the information bits stored in the information bit buffer 111 (step S110). The input information generator 110 may generate the input information bits by overwriting the stored information bits on the predicted information bits.

The input information bits generated by the input information generator 110 and the parity bits stored in the parity bit buffer 108 are input to the error correcting decoder 107, where an error-correcting decoding process is carried out (step S111), and whether the result of the decoding process is satisfactory is decided (step 112). The decoding process may use the MAP algorithm, for example, to obtain a likelihood that each bit is 0 or 1, or may employ a turbo decoding process, in which different convolutional decoders repeatedly supply their results to each other as a-priori probabilities.

When satisfactorily error-free decoding results are obtained, a decision is made as to whether to terminate the decoding process (step S113). To continue the process, the error correcting decoder 107 notifies the transmission request signal controller 113. The transmission request signal controller 113 gives the transmission request signal transmitter 114 an instruction to output a transmission request for data for the next frame. The transmission request signal transmitter 114 sends the transmission request to the encoding apparatus 10A through a network or the like (step S114). In response, the encoding apparatus 10A returns to step S101 to process the next data.

If satisfactory decoding results have not been obtained in step S112, the error correcting decoder 107 notifies the transmission request signal controller 113. The transmission request signal controller 113 gives the transmission request signal transmitter 114 an instruction to output a transmission request for additional data for the same frame, such as additional data for the same bit plane or data for the next bit plane in the same frame. The transmission request signal transmitter 114 sends a transmission request to the encoding apparatus 10A through the network (step S115). In response, the encoding apparatus 10A returns to step S104 in order to transmit additional data from one of its buffers. Transmission requests for additional data may be sent repeatedly until the error correcting decoder 107 decides in step S112 that satisfactory decoding results have been obtained. Satisfactory decoding results can be recognized when, for example, the log likelihood obtained in decoding using the MAP algorithm exceeds a predetermined value.

The decision in step S112 may be made on a bit-plane-by-bit-plane-basis, instead of a frame-by-frame basis.

When the encoding apparatus 10A receives a transmission request from the decoding apparatus, the transmission request signal receiver 106 identifies the type of data requested, e.g., data in the next bit plane or the next frame, or additional data in the same bit plane or the same frame (step S116).

If additional data for the same bit plane or the same frame etc. are requested, the transmission request signal receiver 106 notifies the bit transmission controller 105 (step S117). The bit transmission controller 105 commands the parity bit buffer 102 or information bit buffer 104 to output the requested data (step S104). The bit transmitter 103 sends the requested data (step S105).

If new data such as data for the next bit plane or the next frame are requested, the encoding process for the next bit plane or next frame starts from step S101.

The coding system 10 repeats the processing described above until an end command is issued (step S113).

The operation of the error correcting decoder 107 in the decoding apparatus 10B will next be described in detail, on the assumption that the error correcting decoder 107 uses the MAP. As explained above, in the MAP algorithm the input bit values received from the input information generator 110 and the parity bit values received from the parity bit buffer 108 are used to calculate metrics that indicate whether the true value of each information bit is more likely to be 0 or 1. In the present invention, however, the input bit values include not only the conventional bit values predicted by the input information generator 110 as side information, but also occasional information bit values received directly from the encoding apparatus 10A.

Figure 4:
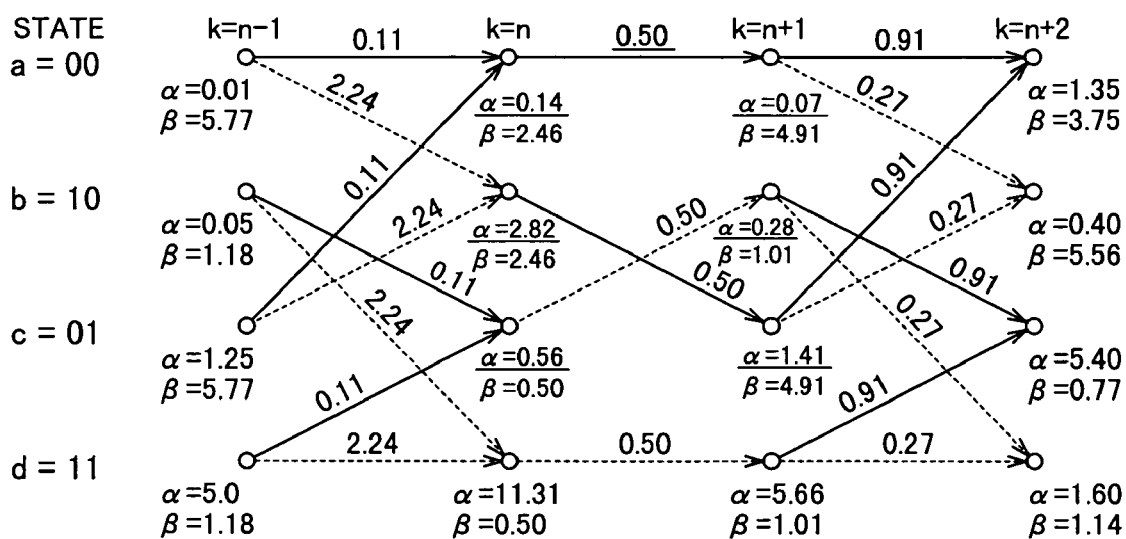
FIG. 4 illustrates the result of removing paths with branch metric values of zero from the trellis diagram in FIG. 3C.

FIGS. 7A, 7B, and 7C illustrate the operation of the error correcting decoder 107 in the first embodiment by showing an example of calculations analogous to the conventional calculations illustrated in FIGS. 4A, 4B, and 4C.

A systematic convolutional encoder with a constraint length of three and a coding rate of one-half is used in this example, as shown in FIG. 7A. Information bits u $\{1, 0, 0\}$ and parity bits v $\{1, 0, 1\}$ are generated at times n−1, n, and n+1. Of these bits, only the information bit (0) for time n is transmitted.

Suppose that the decoding apparatus updates the predicted values x $\{1.5, 0.0, -0.6\}$ of the information bits in FIG. 4B to $\{1.5, -1.0, -0.6\}$ because the information bit (0) for time n has been received, as shown in FIG. 7B. The parity bits y in FIG. 7B are $\{0.0, 0.0, 0.0\}$, indicating that they have not been transmitted.

For the transition from time n to time n+1, branch metrics are calculated as follows.

Given the known information bit of zero (i=0) input at time n, branch metrics for the resulting transitions from states a (00), b (10), c (01), and d (11) are calculated as in equations (23) to (26). The a-priori probability ($\pi^{i=0}_k$) of input of a zero bit at time k is one-half (0.5). The parameters $A_k$ and $\sigma^2$ are taken to be unity.

$$\delta^{i=0,m=a}_k = A_k \pi^{i=0}_k \exp(y_k v^{i=0,m=a}_k / \sigma^2) \qquad (23)$$
$$= 0.5\exp(y_k v^{i=0,m=a}_k)$$
$$= 0.5\exp((0.0)\times(-1))$$
$$= 0.50$$

$$\delta^{i=0,m=b}_k = A_k \pi^{i=0}_k \exp(y_k v^{i=0,m=b}_k / \sigma^2) \qquad (24)$$
$$= 0.5\exp(y_k v^{i=0,m=b}_k)$$
$$= 0.5\exp((0.0)\times(-1))$$
$$= 0.50$$

$$\delta^{i=0,m=c}_k = A_k \pi^{i=0}_k \exp(y_k v^{i=0,m=c}_k / \sigma^2) \qquad (25)$$
$$= 0.5\exp(y_k v^{i=0,m=c}_k)$$
$$= 0.5\exp((0.0)\times(+1))$$
$$= 0.50$$

$$\delta^{i=0,m=d}_k = A_k \pi^{i=0}_k \exp(y_k v^{i=0,m=d}_k / \sigma^2) \qquad (26)$$
$$= 0.5\exp(y_k v^{i=0,m=d}_k)$$
$$= 0.5\exp((0.0)\times(+1))$$
$$= 0.50$$

If the transmitted bits are assumed to be received without corruption, there is zero likelihood that the information bit input at time n has a value of 1, yielding the zero branch metrics expressed by equations (27) to (30).

$$\delta^{i=1,m=a}_k = 0 \qquad (27)$$

$$\delta^{i=1,m=b}_k = 0 \qquad (28)$$

$$\delta^{i=1,m=c}_k = 0 \qquad (29)$$

$$\delta^{i=1,m=d}_k = 0 \qquad (30)$$

In contrast to the prior art shown in FIG. 3C, in FIG. 7C the values of the branch metrics on the dotted lines extending from time n are all 0.0. This is because the dotted lines represent information bit values of 1, and given a guaranteed value of 0 for the information bit at the transition from time n to time n+1, an information bit value of 1 cannot be output.

For the transition from time n−1 to time n, branch metrics are calculated as follows.

Since the encoding apparatus does not transmit any bit at time n−1, the calculation is divided into two cases corresponding to information bit values of 0 and 1, expressed as follows.

$$u^{i=0}_{k=n-1} = -1$$

$$u^{i=1}_{k=n-1} = -1$$

The calculations for the two cases are expressed by equations (31) and (32).

$$\delta^{i=0,m}_{k=n-1} = A_{k=n-1} \pi^{i=0}_{k=n-1} \exp(x_{k=n-1} u^{i=0}_{k=n-1}/\sigma^2) \quad (31)$$
$$= A_{k=n-1} \pi^{i=0}_{k=n-1} \exp(-x_{k=n-1}/\sigma^2)$$

$$\delta^{i=1,m}_{k=n-1} = A_{k=n-1} \pi^{i=1}_{k=n-1} \exp(x_{k=n-1} u^{i=1}_{k=n-1}/\sigma^2) \quad (32)$$
$$= A_{k=n-1} \pi^{i=1}_{k=n-1} \exp(-x_{k=n-1}/\sigma^2)$$

Assuming again that $A_{k=n-1}=1$ and $\sigma^2=1$, equation (31) gives equation (33), and equation (32) gives equation (34).

$$\delta^{i=0,m}_{k=n-1} = A_{k=n-1} \pi^{i=0}_{k=n-1} \exp(-x_{k=n-1}/\sigma^2) \quad (33)$$
$$= 0.5 \exp(-x_{k=n-1})$$
$$= 0.5 \exp(-(1.5))$$
$$= 0.11$$

$$\delta^{i=1,m}_{k=n-1} = A_{k=n-1} \pi^{i=1}_{k=n-1} \exp(x_{k=n-1}/\sigma^2) \quad (34)$$
$$= 0.5 \exp(x_{k=n-1})$$
$$= 0.5 \exp(1.5)$$
$$= 2.24$$

The branch metric calculations for the transition from time n+1 to time n+2 are similar to the branch metric calculations for the transition from time n−1 to time n, and give the results shown in FIG. 7C.

The calculation of the decoded bit values will be described by using FIG. 7C.

The process of decoding the information bit for the transition from time n−1 to time n will be described. If an information bit value of 0 is assumed to have been input for the transition from time n−1 to time n, a value is calculated as expressed by equation (35). If an information bit value of 1 is assumed to have been input for the transition from time n−1 to time n, a value is calculated as expressed by equation (36). Based on these calculated values, the log likelihood of the bit value obtained by equation (37) is 1.31. As this value is positive, a correctly decoded information bit value of 1 is obtained.

$$\alpha^{m=a}_{k=n-1} \times \delta^{i=0,m=a}_{k=n-1} \times \beta^{m=a}_{k=n} + \alpha^{m=b}_{k=n-1} \times \delta^{i=0,m=b}_{k=n-1} \times \beta^{m=c}_{k=n} + \quad (35)$$
$$\alpha^{m=c}_{k=n-1} \times \delta^{i=0,m=c}_{k=n-1} \times \beta^{m=a}_{k=n} + \alpha^{m=d}_{k=n-1} \times \delta^{i=0,m=d}_{k=n-1} \times \beta^{m=c}_{k=n} +$$
$$0.01 \times 0.11 \times 2.46 + 0.05 \times 0.11 \times 0.56 +$$
$$1.25 \times 0.11 \times 2.46 + 5.0 \times 0.11 \times 2.46 = 1.705299585$$

$$\alpha^{m=a}_{k=n-1} \times \delta^{i=1,m=a}_{k=n-1} \times \beta^{m=b}_{k=n} + \alpha^{m=b}_{k=n-1} \times \delta^{i=1,m=b}_{k=n-1} \times \beta^{m=d}_{k=n} + \quad (36)$$
$$\alpha^{m=c}_{k=n-1} \times \delta^{i=1,m=c}_{k=n-1} \times \beta^{m=b}_{k=n} + \alpha^{m=d}_{k=n-1} \times \delta^{i=1,m=d}_{k=n-1} \times \beta^{m=d}_{k=n} +$$
$$5.77 \times 2.24 \times 2.46 + 0.05 \times 2.24 \times 2.46 +$$
$$1.25 \times 2.24 \times 2.46 + 5.0 \times 2.24 \times 2.46 = 34.72610064$$

$$\log(34.7261/1.705299585) = 1.31 \quad (37)$$

The process of decoding the information bit for the transition from time n to time n+1 will now be described. If an information bit value of 0 is assumed to have been input for the transition from time n to time n+1, a value is calculated as expressed by equation (38). If an information bit value of 1 is assumed to be input for the transition from time n to time n+1, a value is calculated as expressed by equation (39). Based on these calculated values, the log likelihood of the bit value obtained by equation (40) is −∞. As this value is negative, a correctly decoded information bit value of 0 is obtained.

$$\alpha^{m=a}_{k=n} \times \delta^{i=0,m=a}_{k=n} \times \beta^{m=a}_{k=n+1} + \alpha^{m=b}_{k=n} \times \delta^{i=0,m=b}_{k=n} \times \beta^{m=c}_{k=n+1} + \quad (38)$$
$$\alpha^{m=c}_{k=n} \times \delta^{i=0,m=c}_{k=n} \times \beta^{m=a}_{k=n+1} + \alpha^{m=d}_{k=n} \times \delta^{i=0,m=d}_{k=n} \times \beta^{m=c}_{k=n+1} +$$
$$0.14 \times 0.50 \times 4.91 + 2.82 \times 0.50 \times 4.91 +$$
$$0.56 \times 0.50 \times 4.91 + 11.31 \times 0.50 \times 4.91 = 36.43140023$$

$$\alpha^{m=a}_{k=n} \times \delta^{i=1,m=a}_{k=n} \times \beta^{m=b}_{k=n+1} + \alpha^{m=b}_{k=n} \times \delta^{i=1,m=b}_{k=n} \times \beta^{m=d}_{k=n+1} + \quad (39)$$
$$\alpha^{m=c}_{k=n} \times \delta^{i=1,m=c}_{k=n} \times \beta^{m=b}_{k=n+1} + \alpha^{m=d}_{k=n} \times \delta^{i=1,m=d}_{k=n} \times \beta^{m=d}_{k=n+1} +$$
$$0.14 \times 0.0 \times 1.01 + 2.82 \times 0.0 \times 1.01 +$$
$$0.56 \times 0.0 \times 1.01 + 11.31 \times 0.0 \times 1.01 = 0$$

$$\log(0/36.43140023) = -\infty \quad (40)$$

The process of decoding the information bit for the transition from time n+1 to time n+2 will also be described. If an information bit value of 0 is assumed to have been input for the transition from time n+1 to time n+2, a value is calculated as expressed by equation (41). If an information bit value of 1 is assumed to have been input for the transition from time n+1 to time n+2, a value is calculated as expressed by equation (42). Based on these calculated values, the log likelihood of the bit value, obtained by equation (43), is −0.36. As this value is negative, a correctly decoded information bit value of 0 is obtained.

$$\alpha^{m=a}_{k=n+1} \times \delta^{i=0,m=a}_{k=n+1} \times \beta^{m=a}_{k=n+2} + \alpha^{m=b}_{k=n+1} \times \delta^{i=0,m=b}_{k=n+1} \times \beta^{m=c}_{k=n+2} + \quad (41)$$
$$\alpha^{m=c}_{k=n+1} \times \delta^{i=0,m=c}_{k=n+1} \times \beta^{m=a}_{k=n+2} + \alpha^{m=d}_{k=n+1} \times \delta^{i=0,m=d}_{k=n+1} \times \beta^{m=c}_{k=n+2} +$$
$$0.35 \times 0.91 \times 3.75 + 0.00 \times 0.91 \times 0.77 +$$
$$7.07 \times 0.91 \times 3.75 + 0.00 \times 0.91 \times 0.77 = 25.30112813$$

$$\alpha^{m=a}_{k=n+1} \times \delta^{i=1,m=a}_{k=n+1} \times \beta^{m=b}_{k=n+2} + \alpha^{m=b}_{k=n+1} \times \delta^{i=1,m=b}_{k=n+1} \times \beta^{m=d}_{k=n+2} + \quad (42)$$
$$\alpha^{m=c}_{k=n+1} \times \delta^{i=1,m=c}_{k=n+1} \times \beta^{m=b}_{k=n+2} + \alpha^{m=d}_{k=n+1} \times \delta^{i=1,m=d}_{k=n+1} \times \beta^{m=d}_{k=n+2} +$$
$$0.35 \times 0.27 \times 5.56 + 0.00 \times 0.27 \times 1.14 +$$
$$7.07 \times 0.27 \times 5.66 + 0.00 \times 0.27 \times 1.14 = 11.1302721$$

$$\log(11.13027/25.30113) = -0.36 \quad (43)$$

Figure 8:
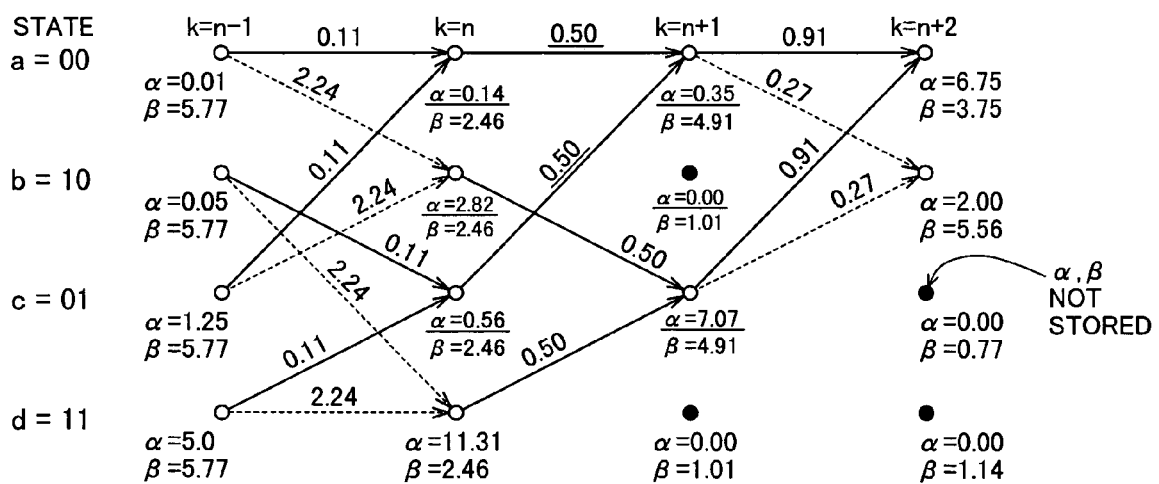
FIG. 8 illustrates the result of removing paths with branch metric values of zero from the trellis diagram in FIG. 7C.

FIG. 8 illustrates the result of removing paths with branch metric values of zero from the trellis diagram in FIG. 7C. If a single information bit can be received correctly, the computation of eight paths can be eliminated, as compared with FIG. 7C. Moreover, the values of forward state metrics α and backward state metrics β related to four states do not have to be stored.

In the first embodiment, instead of transmitting only parity bits, the encoding apparatus transmits a combination of information bits and parity bits to the decoding apparatus. While maintaining the correctness of the decoded results, this enables the decoding apparatus to rule out certain states at certain times and remove their associated paths. The amount of computation required by the MAP algorithm can be reduced accordingly. As can be seen from a comparison between FIGS. 4 and 8, transmitting a single information bit instead of a single parity bit eliminates the computations associated with four paths.

Eliminating states also eliminates the need to store their forward and backward state metrics α and β. This reduces the memory usage of the decoding apparatus. In the example shown in FIGS. 7A to 7C, and FIG. 8, transmitting a single information bit eliminates the need to store forward and backward state metrics α and β for four states.

Second Embodiment

Figure 9:
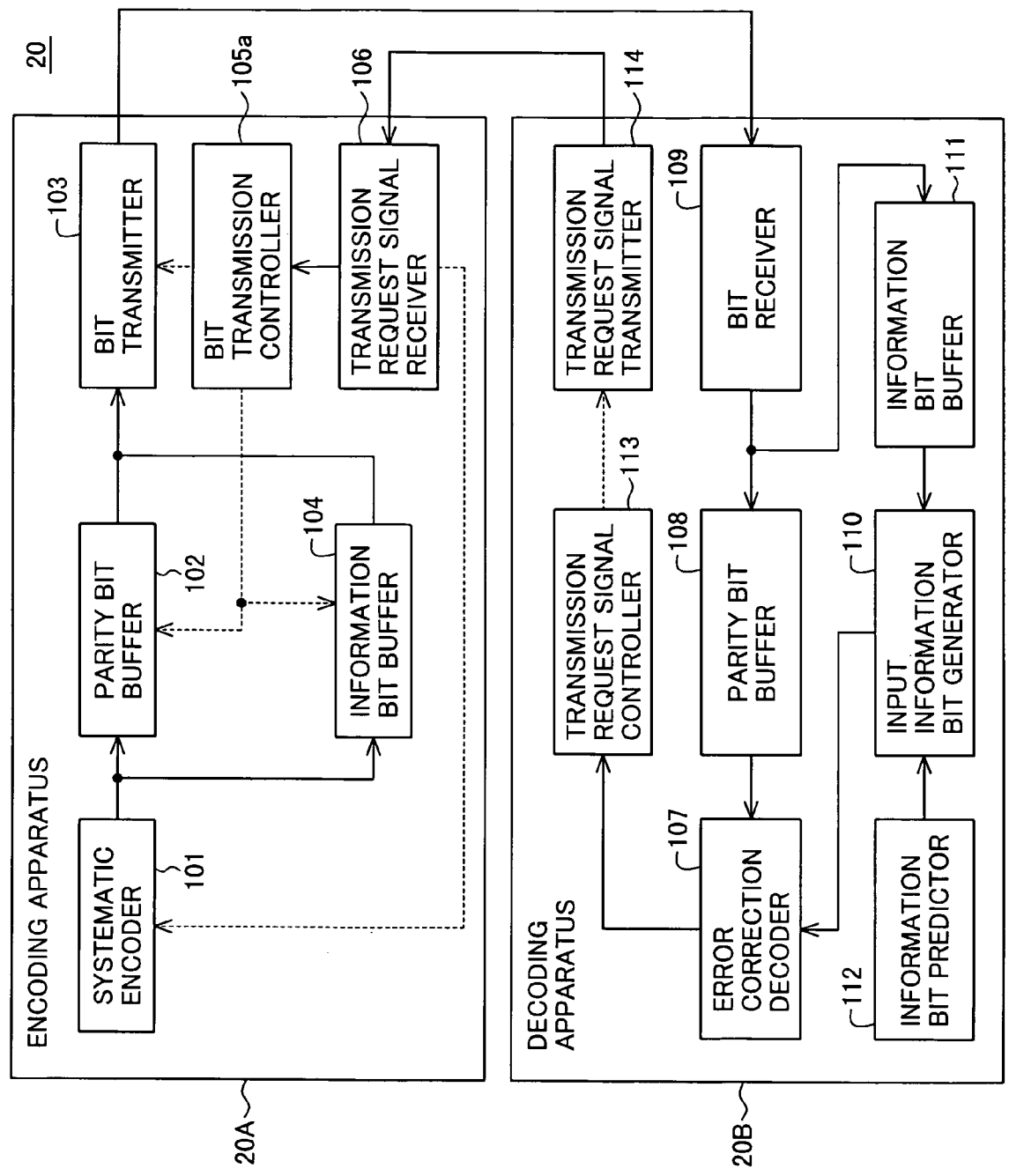
FIG. 9 is a block diagram showing the structure of a coding system according to a second embodiment of the invention.
Figure 10:
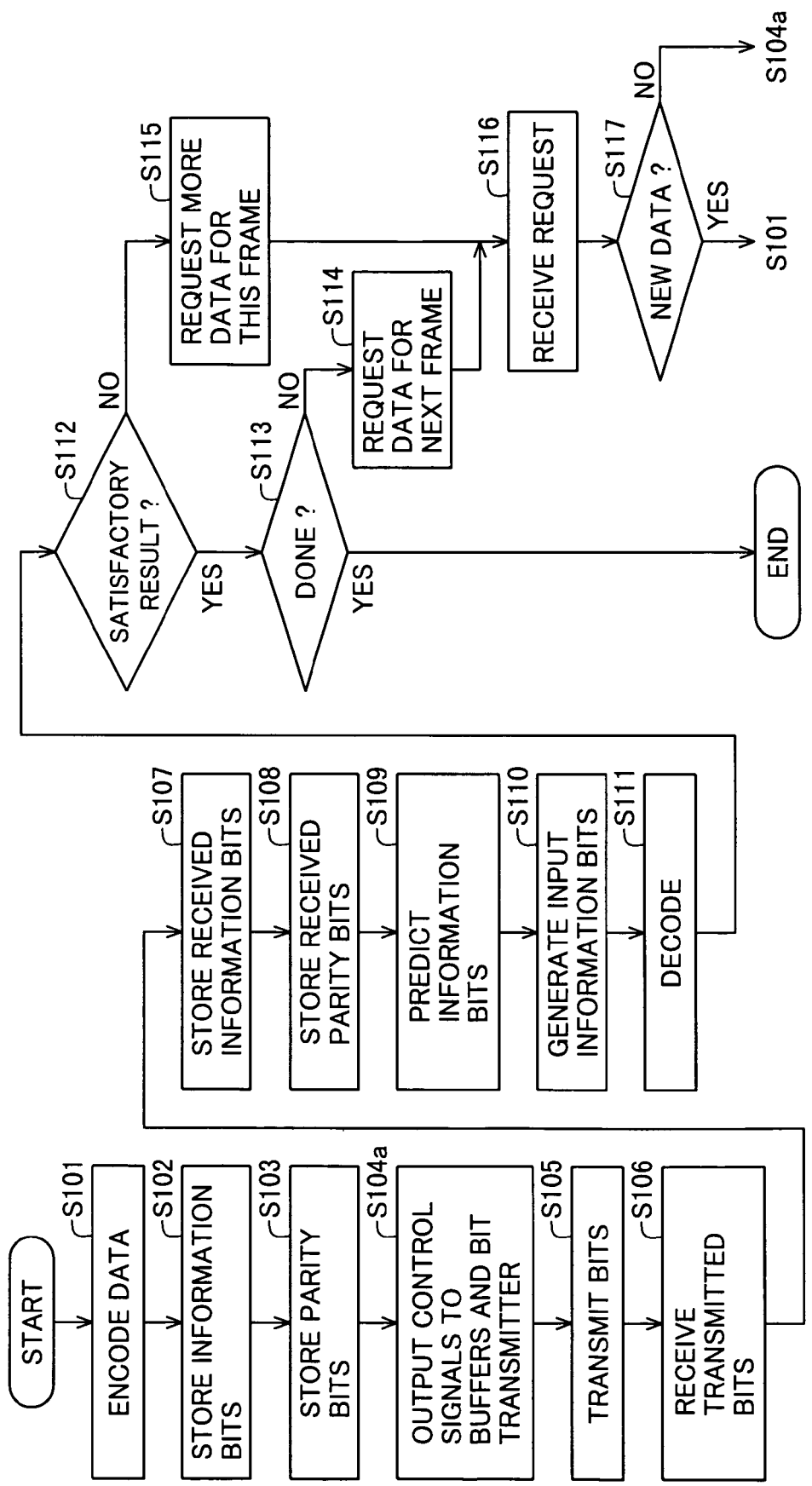
FIG. 10 is a flowchart illustrating the operation of the coding system in the second embodiment.

Referring to FIG. 9, the second embodiment is a coding system 20 comprising an encoding apparatus 20A and a decoding apparatus 20B identical to the decoding apparatus 10B in the first embodiment. The encoding apparatus 20A differs from the encoding apparatus 10A in the first embodiment only in regard to the bit transmission controller 105a, the operation and functions of which will be described below with reference to the flowchart in FIG. 10. Steps identical to steps in the first embodiment, shown in FIG. 6, are indicated by the same reference characters.

The second embodiment differs from the first embodiment in that step S104 is replaced by step S104a.

In step S104a, the bit transmission controller 105a gives the parity bit buffer 102, information bit buffer 104, and bit transmitter 103 instructions to transmit parity bits and information bits in accordance with, for example, a predetermined table. This table is similar to the table used in the first embodiment, except that it specifies the transmission of information bits in consecutive pairs, or non-consecutive pairs, or information bits paired with parity bits. A plurality of tables are provided in the bit transmission controller 105a, enabling the bit transmission controller 105a to select a table that fits the requirements of the decoding apparatus, as explained below.

Figure 11A:
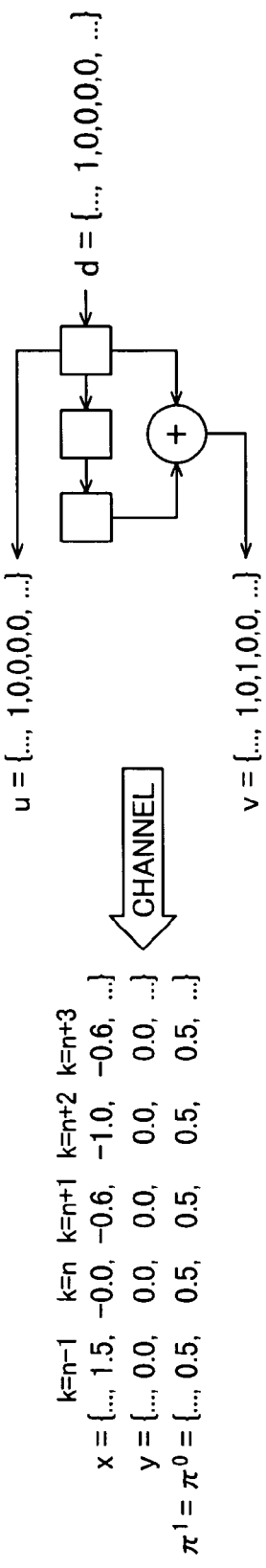
FIGS. 11A, 11B, and 11C illustrate the operation of the error correcting decoder in the second embodiment when the computational load is reduced.
Figure 11B:
Figure 11C:
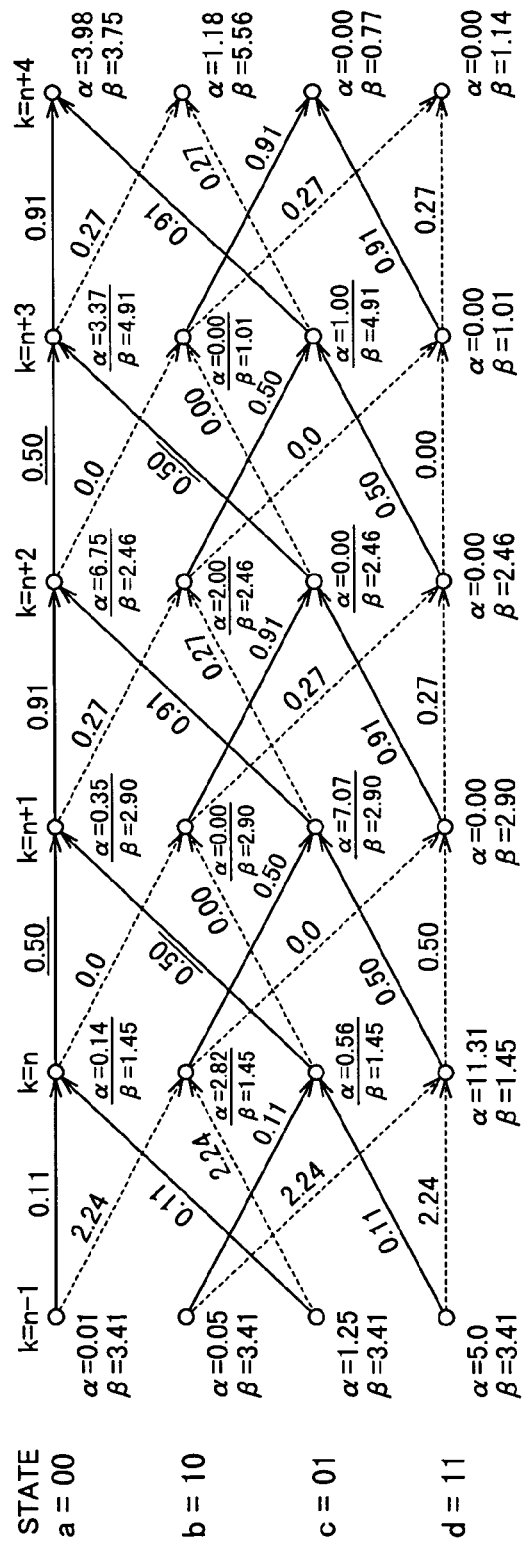

If a reduction of memory usage is the main requirement of the decoding apparatus, the bit transmission controller 105a causes two information bits separated by one non-transmitted information bit to be transmitted (instead of the transmission of information bits at, for example, thirty-two bit intervals). FIGS. 11A, 11B, and 11C illustrate the operation of the error correcting decoder 107 in the decoding apparatus 20B for this case.

The error correcting decoder 107 in the decoding apparatus 10B is assumed to use the MAP algorithm in the error-correcting decoding process. In the operation illustrated in FIG. 11A, a systematic convolutional encoder with a constraint length of three and a coding rate of one-half is used. At times n−1, n, n+1, n+2, and n+3, the information bits u {1, 0, 0, 0, 0} and parity bits v {1, 0, 1, 0, 0} are generated. However, only the information bits (both 0) for time n and time n+2 are transmitted.

The decoding apparatus calculates a predicted value for each information bit. Upon receiving the information bits (0) for time n and time n+2, the apparatus updates its previously predicted bit values x for times n−1 to n+3 to {1.5, −1.0, −0.6, −1.0, ×0.6}. No parity bits have been received for these times, so the received parity bit values y are {0.0, 0.0, 0.0, 0.0, 0.0}.

For the transitions from time n−1 to time n, from time n to time n+1, and from time n+1 to time n+2, branch metrics are calculated in the same way as in the first embodiment. For the transition from time n+2 to time n+3, branch metrics are calculated in the same way as for the transition from time n to time n+1. For the transition from time n+3 to time n+4, branch metrics are calculated in the same way as for the transition from time n+1 to time n+2. A description of the calculations will be omitted; the calculated metrics are simply shown in FIG. 11C.

Figure 12:
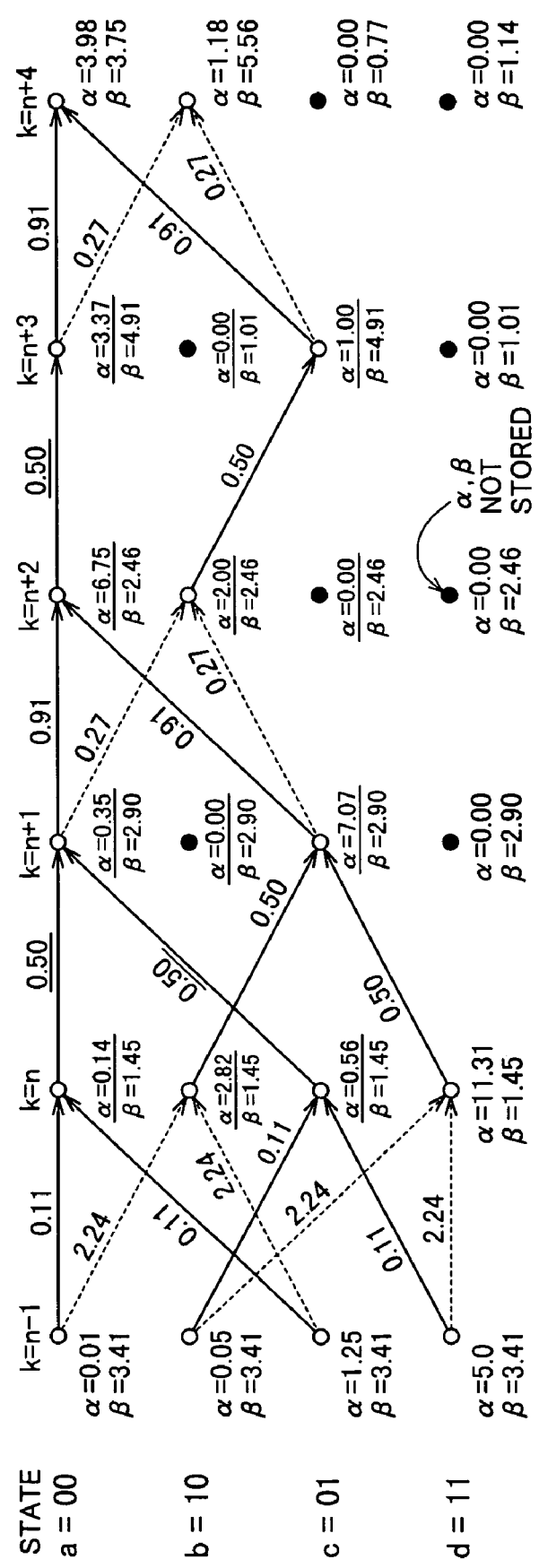
FIG. 12 illustrates the result of removing paths with branch metric values of zero from the trellis diagram in FIG. 11C.

FIG. 12 illustrates the result of removing paths with branch metric values of zero from the trellis diagram in FIG. 11C. If the two information bits can be received correctly, the computations associated with eighteen paths can be eliminated, as shown. In addition, the values of forward and backward state metrics α and β related to eight states need not be stored, so memory usage is reduced.

If a reduction of computational load is the main requirement of the decoding apparatus, the bit transmission controller 105a causes two or more information bits to be transmitted in succession. FIGS. 13A, 13B, and 13C illustrate the operation of the error correcting decoder 107 in the decoding apparatus 10B when two information bits are transmitted in succession.

In the illustrated operation, a systematic convolutional encoder with a constraint length of three and a coding rate of one-half is used. At times n−1, n, n+1, n+2, and n+3, the information bits u {1, 0, 0, 0, 0} and parity bits v {1, 0, 1, 0, 0} are generated, but only the information bits (both 0) for time n and time n+1 are transmitted.

The decoding apparatus obtains a predicted value for each information bit. Receiving the information bit (0) for time n and the information bit (0) for time n+1, the apparatus updates the predicted value to x {1.5, −1.0, −1.0, −0.6, −0.6}. The parity bits y {0.0, 0.0, 0.0, 0.0, 0.0} are assumed to be received. The value 0.0 represents a parity bit value not transmitted from the encoding apparatus.

Branch metrics are calculated in the same way as in the first and second embodiments. FIG. 13C shows the calculated metric values.

Figure 14:
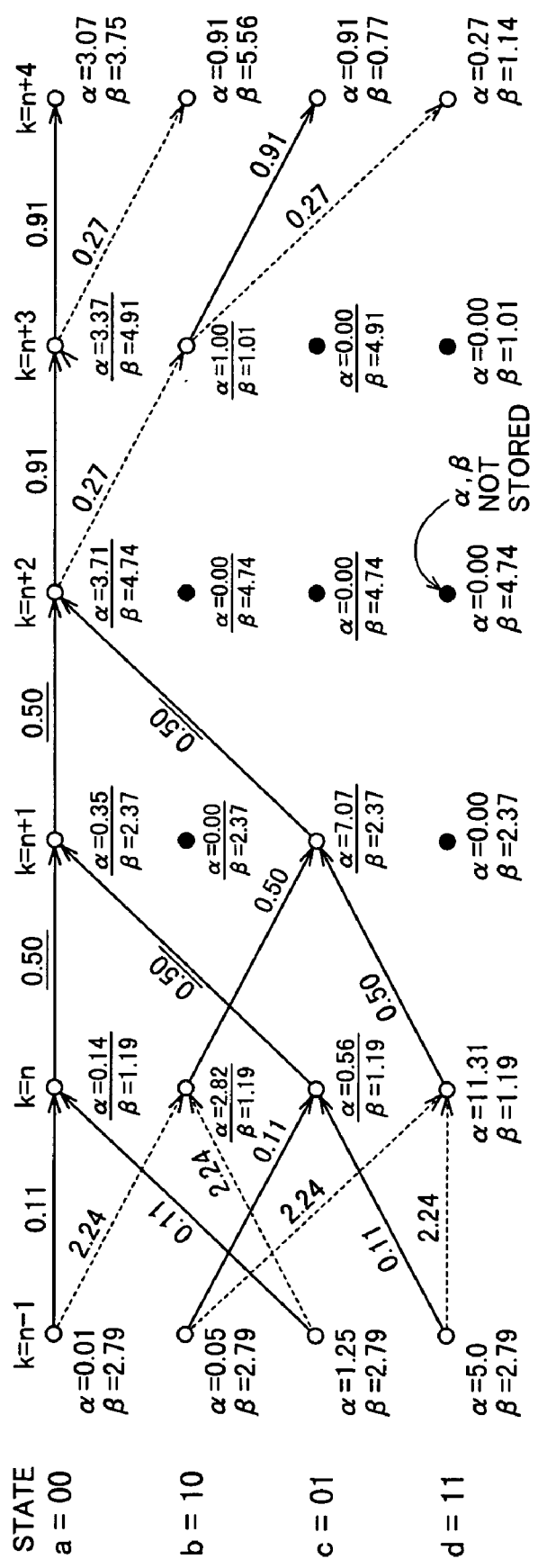
FIG. 14 illustrates the result of removing paths with branch metric values of zero from the trellis diagram in FIG. 13C.

FIG. 14 illustrates the result of removing paths with branch metric values of zero from the trellis diagram in FIG. 13C. If two successive information bits can be received correctly, the computations associated with twenty paths can be eliminated, as shown. In addition, the values of forward and backward state metrics α and β related to seven states need not be stored, so memory usage can also be reduced.

The second embodiment achieves the same general effect as the first embodiment, but can alter the effect to provide a greater reduction of memory usage or a greater reduction of computational load, to satisfy the requirements of the decoding apparatus, by changing the method of transmitting the information bits.

If a reduction of memory usage is the main requirement of the decoding apparatus, information bits may be transmitted, eliminating the need to store the values of the forward and backward state metrics α and β related to eight states, one state more than when pairs of consecutive information bits are transmitted.

If a reduction of computational load is the main requirement of the decoding apparatus, successive information bits may be transmitted to eliminate the computations for twenty paths, two more than the number of paths for which computations are eliminated by transmitting a non-consecutive pair of information bits. If two successive information bits are transmitted and the convolutional encoder has a constraint length of three, a single state can be identified for time n+2. Accordingly, an improvement in error-correcting capability can be expected.

Other Embodiments

Some variations of embodiments have been described above; further modifications will be described below.

Although the MAP algorithm is used for decoding in the description of the first and second embodiments, other algorithms such as the log-MAP algorithm and max-log-MAP algorithm can also be used. The present invention can be applied to all decoding algorithms that keep track of a plurality of states over time and calculate values for possible state transitions representing input of data bits.

A systematic convolutional encoder with a constraint length of three and a coding rate of one-half is used in the description of the first and second embodiments, but other convolutional encoders can also be used.

The second embodiment described the transmission of two information bits at an interval of one bit, but it is possible to transmit information bits at intervals of two or more bits, still achieving a reduction in memory usage and computational load.

The second embodiment described the successive transmission of two information bits, but it is possible to transmit three or more successive information bits to achieve a reduction in memory usage and computational load. In particular, if a convolutional code with a given constraint length M is used, transmitting at least M−1 information bits in succession enables the decoder to eliminate numerous path metric calculations by identifying states in the trellis diagram, so this bit transmission strategy can be used as a particularly effective method of reducing the computational load.

The second embodiment described only the transmission of information bits, but similar techniques can be applied to the transmission of parity bits. For example an information bit and the parity bit generated by input of the information bit to the encoder can be transmitted as a pair of bits to reduce the computational load by improving the decoding accuracy, so that the decoding process finishes in fewer iterations. Transmitting such pairs of parity and information bits at intervals of one or more information bits, or transmitting two such pairs of parity and information bits in succession, can both improve decoding accuracy and greatly reduce memory usage by the decoder or its computational load. Alternatively, M−1 such pairs of parity and information bits can be transmitted in succession, where M is any integer greater than two, such as an integer equal to the constraint length, to reduce the computational load still more.

In the description of the preceding embodiments, a convolutional encoder of the non-feedback type was used, but a convolutional encoder of the feedback type may also be used. The transmission of information bits and parity bits in pairs is effective when a feedback convolutional encoder is used.

In the description of the second embodiment, the encoding apparatus knows the requirements of the decoding apparatus beforehand. A more flexible system can be established by allowing the encoding apparatus to accept requests for reduced memory usage or reduced computational load from the decoding apparatus and modify its information bit transmission scheme accordingly. Such requests may be included in one of the transmission request signals transmitted by the transmission request signal transmitter in the decoding apparatus and received by the transmission signal request receiver in the encoding apparatus. If the decoding apparatus is implemented on a personal computer, transmission request signals of this type may be sent in response to user input requesting for example, improved display of moving pictures.

Those skilled in the art will recognize that still further variations are possible within the scope of the invention, which is defined in the appended claims.

What is claimed is:

1. An encoding apparatus comprising:
a systematic encoder for encoding input data to generate information bits and parity bits, the information bits representing the input data, the parity bits providing redundancy for error correction;
an information bit storage unit for storing the information bits generated by the systematic encoder;
a parity bit storage unit for storing the parity bits generated by the systematic encoder;
a bit transmission controller for controlling selective output of bits stored in the information bit storage unit and the parity bit storage unit; and
a bit transmitter for transmitting the bits output from the information bit storage unit and the parity bit storage unit to a decoding apparatus under control of the bit transmission controller wherein the bit transmission controller causes at least two information bits generated consecutively by the systematic encoder to be output from the information storage unit for transmission to the decoding apparatus;
wherein the bit transmission controller causes at least two information bits generated consecutively by the systematic encoder to be output from the information storage unit for transmission to the decoding apparatus; and
wherein the bit transmission controller also causes parity bits generated simultaneously with the at least two information bits generated consecutively by the systematic encoder to be output from the information storage unit for transmission to the decoding apparatus.

2. An encoding apparatus comprising:
a systematic encoder for encoding input data to generate information bits and parity bits, the information bits representing the input data, the parity bits providing redundancy for error correction;
an information bit storage unit for storing the information bits generated by the systematic encoder;
a parity bit storage unit for storing the parity bits generated by the systematic encoder;
a bit transmission controller for controlling selective output of bits stored in the information bit storage unit and the parity bit storage unit; and
a bit transmitter for transmitting the bits output from the information bit storage unit and the parity bit storage unit to a decoding apparatus under control of the bit transmission controller wherein the bit transmission controller causes at least two information bits generated consecutively by the systematic encoder to be output from the information storage unit for transmission to the decoding apparatus;
wherein the bit transmission controller causes at least two information bits generated consecutively by the systematic encoder to be output from the information storage unit for transmission to the decoding apparatus; and
wherein the systematic encoder operates with a constraint length M, and the bit transmission controller causes at least M minus one information bits generated consecutively by the systematic encoder to be output from the information storage unit for transmission to the decoding apparatus.

3. An encoding apparatus comprising:
a systematic encoder for encoding input data to generate information bits and parity bits, the information bits representing the input data, the parity bits providing redundancy for error correction;
an information bit storage unit for storing the information bits generated by the systematic encoder;
a parity bit storage unit for storing the parity bits generated by the systematic encoder;
a bit transmission controller for controlling selective output of bits stored in the information bit storage unit and the parity bit storage unit; and
a bit transmitter for transmitting the bits output from the information bit storage unit and the parity bit storage unit to a decoding apparatus under control of the bit transmission controller wherein the bit transmission controller causes at least two information bits generated consecutively by the systematic encoder to be output from the information storage unit for transmission to the decoding apparatus;

wherein the bit transmission controller switches between output of information bits generated consecutively by the systematic encoder and information bits generated non-consecutively by the systematic encoder as requested by the decoding apparatus.

4. A decoding apparatus comprising:

a bit receiver for selectively receiving both information bits and parity bits generated by a systematic encoder in an encoding apparatus;

a parity bit storage unit for storing the parity bits received by the bit receiver;

an information bit storage unit for storing the information bits received by the bit receiver;

an information bit predictor for predicting information bits;

an input information bit generator for generating input information bits by combining the information bits stored in the information bit storage unit with the information bits generated by the information bit predictor; and an error correcting decoder for decoding the parity bits stored in the parity bit storage unit with reference to the input information bits.

5. The decoding apparatus of claim 4, further comprising:

a transmission request signal transmitter for transmitting transmission request signals to the encoding apparatus;

a transmission request control unit for receiving status information from the error correcting decoder and controlling the transmission request signals transmitted to the encoding apparatus according to the status information.

6. The decoding apparatus of claim 4, wherein the information bits stored in the information bit storage unit were generated non-consecutively by the systematic encoder.

7. The decoding apparatus of claim 4, wherein the information bits stored in the information bit storage unit include information bits generated consecutively by the systematic encoder.

8. The decoding apparatus of claim 4, wherein transmission request control unit uses one of the transmission request signals to instruct the encoding apparatus whether to send information bits generated consecutively by the systematic encoder or information bits generated non-consecutively by the systematic encoder.

9. A coding system comprising an encoding apparatus and a decoding apparatus, wherein:

the encoding apparatus comprises a systematic encoder for encoding input data to generate information bits and parity bits, the information bits representing the input data, the parity bits providing redundancy for error correction, an information bit storage unit for storing the information bits generated by the systematic encoder, a parity bit storage unit for storing the parity bits generated by the systematic encoder, a bit transmission controller for controlling selective output of bits stored in the information bit storage unit and the parity bit storage unit, and a bit transmitter for selectively transmitting the bits output from the information bit storage unit and the parity bit storage unit to the decoding apparatus under control of the bit transmission controller; and the decoding apparatus comprises a bit receiver for selectively receiving both the information bits and the parity bits generated by a systematic encoder in the encoding apparatus;

a parity bit storage unit for storing the parity bits received by the bit receiver;

an information bit storage unit for storing the information bits received by the bit receiver;

an information bit predictor for predicting information bits;

an input information bit generator for generating input information bits by combining the information bits stored in the information bit storage unit with the information bits predicted by the information bit predictor; and an error correcting decoder for decoding the parity bits stored in the parity bit storage unit with reference to the input information bits.

10. The coding system of claim 9, further comprising an error-free channel by which the bit transmitter in the encoding apparatus transmits the information bits and the parity bits to the bit receiver in the decoding apparatus.

11. The coding system of claim 9, wherein the bit transmitter encodes the transmitted bits with an error-correcting code enabling transmission errors to be completely corrected by the bit receiver in the decoding apparatus.

12. The coding system of claim 9, wherein:

the decoding apparatus further comprises a transmission request signal transmitter for transmitting transmission request signals to the encoding apparatus, and a transmission request control unit for receiving status information from the error correcting decoder and controlling the transmission request signals transmitted to the encoding apparatus according to the status information;

and the encoding apparatus further comprises a transmission request signal receiver for receiving the transmission request signals from the decoding apparatus, wherein the bit transmission controller causes bits to be output from the information bit storage unit and the parity bit storage unit and transmitted to the decoding apparatus in response to the transmission request signals received by the transmission request signal receiver.

13. The coding system of claim 12, wherein the transmission request control unit uses one of the transmission request signals to instruct the encoding apparatus whether to send information bits generated consecutively by the systematic encoder or information bits generated non-consecutively by the systematic encoder.

* * * * *